(12) United States Patent
Chen

(10) Patent No.: US 12,004,343 B2
(45) Date of Patent: Jun. 4, 2024

(54) METHOD OF MANUFACTURING CAPACITOR CONNECTING LINE OF MEMORY

(71) Applicant: CHANGXIN MEMORY TECHNOLOGIES, INC., Hefei (CN)

(72) Inventor: Yang Chen, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 325 days.

(21) Appl. No.: 17/648,464

(22) Filed: Jan. 20, 2022

(65) Prior Publication Data

US 2022/0149049 A1 May 12, 2022

Related U.S. Application Data

(63) Continuation of application No. PCT/CN2021/118675, filed on Sep. 16, 2021.

(30) Foreign Application Priority Data

Nov. 5, 2020 (CN) .......................... 202011221664.2

(51) Int. Cl.
*H10B 12/00* (2023.01)
(52) U.S. Cl.
CPC .................. *H10B 12/482* (2023.02)
(58) Field of Classification Search
CPC ............................ H10B 12/482; H10B 12/485
USPC ........................................................ 438/262
See application file for complete search history.

(56) References Cited

U.S. PATENT DOCUMENTS

2014/0154863 A1 6/2014 Seo
2014/0291804 A1* 10/2014 Kim ..................... H10B 12/315
257/532

FOREIGN PATENT DOCUMENTS

CN 107230675 A 10/2017
CN 107275286 A 10/2017
CN 111192876 A 5/2020

OTHER PUBLICATIONS

International Search Report cited in PCT/CN2021/118675 mailed Nov. 26, 2021, 9 pages.

* cited by examiner

*Primary Examiner* — Hoai V Pham
(74) *Attorney, Agent, or Firm* — Cooper Legal Group, LLC

(57) ABSTRACT

The present disclosure provides a method of manufacturing a capacitor connecting line of a memory and a memory. The method of manufacturing includes: forming a bit line layer and a first dielectric layer on a substrate sequentially; patterning the bit line layer and the first dielectric layer, and forming bit line structures arranged at intervals along a first direction and dielectric structures on tops of the bit line structures; forming an insulating layer on the substrate with the bit line structures and the dielectric structures formed thereon, to completely cover the bit line structures and the dielectric structures; forming second isolation structures arranged at intervals between adjacent bit line structures; and forming conductive structures between first isolation structures and the second isolation structures, and forming storage node contact structures.

9 Claims, 15 Drawing Sheets

METHOD OF MANUFACTURING CAPACITOR CONNECTING LINE OF MEMORY

CROSS-REFERENCE TO RELATED APPLICATIONS

This is a continuation of International Application No. PCT/CN2021/118675, filed on Sep. 16, 2021, which claims the priority to Chinese Patent Application 202011221664.2, titled "METHOD OF MANUFACTURING CAPACITOR CONNECTING LINE OF MEMORY AND MEMORY" and filed on Nov. 5, 2020. The entire contents of International Application No. PCT/CN2021/118675 and Chinese Patent Application 202011221664.2 are incorporated herein by reference.

TECHNICAL FIELD

The present disclosure relates to, but is not limited to, a method of manufacturing a capacitor connecting line of a memory and a memory.

BACKGROUND

A dynamic random access memory (DRAM) is a semiconductor device comprising a capacitor structure, wherein a capacitor is formed after a bit line layer is formed, and the capacitor is connected to an active region through a storage node contact plug. In recent years, the number and density of memory cells on the DRAM chip have increased dramatically, while the size of the device has gradually decreased. In order to realize the effective connection between the capacitor and the active region, the storage node contact plug needs to have a larger size. In the existing process, when the storage node contact holes with a larger critical dimension line width are etched, it is likely to cause short circuit due to incomplete etching.

SUMMARY

An overview of the subject matter detailed in the present disclosure is provided below, which is not intended to limit the protection scope of the claims.

The present disclosure provides a method of manufacturing a capacitor connecting line of a memory and a memory.

A first aspect of the present disclosure provides a method of manufacturing a capacitor connecting line of a memory, including: forming a bit line layer and a first dielectric layer on a substrate sequentially; patterning the bit line layer and the first dielectric layer, and forming bit line structures arranged at intervals along a first direction and dielectric structures on tops of the bit line structures, wherein a width of a top cross section of the dielectric structures is larger than a width of a cross section of the bit line structures; forming an insulating layer on the substrate with the bit line structures and the dielectric structures formed thereon, to completely cover the bit line structures and the dielectric structures; patterning the insulating layer with the dielectric structures as a mask in the first direction, forming first isolation structures on sidewalls of the bit line structures, and patterning the insulating layer in a second direction, to form second isolation structures arranged at intervals between adjacent bit line structures; and forming conductive structures between the first isolation structures and the second isolation structures, and forming storage node contact structures.

A second aspect of the present disclosure provides a memory, including: the memory being manufactured through the method of manufacturing a capacitor connecting line of a memory according to the first aspect.

Other aspects of the present disclosure are understandable upon reading and understanding of the accompanying drawings and detailed description.

BRIEF DESCRIPTION OF THE DRAWINGS

The accompanying drawings incorporated into the specification and constituting part of the specification illustrate the embodiments of the present disclosure, and are used together with the description to explain the principles of the embodiments of the present disclosure. In these accompanying drawings, similar reference numerals are used to represent similar elements. The accompanying drawings in the following description are part rather than all of the embodiments of the present disclosure. Those skilled in the art may derive other drawings based on these drawings without creative efforts.

DETAILED DESCRIPTION

Figure 1:
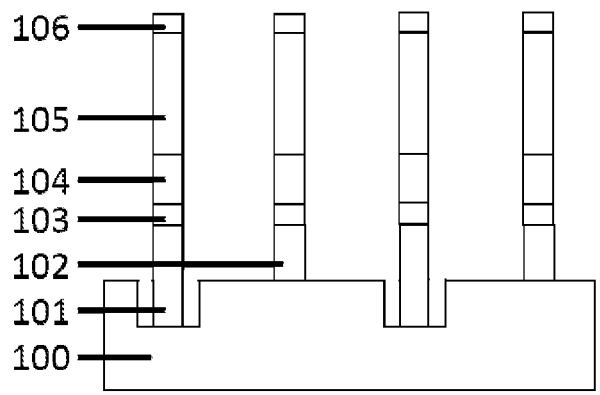
FIG. 1 is a schematic diagram of a capacitor connecting line of a memory according to an embodiment of the present disclosure.

The technical solutions in the embodiments of the present disclosure are described below clearly and completely with reference to the drawings in the embodiments of the present disclosure. Apparently, the described embodiments are merely part rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

According to the solutions provided in the present disclosure, a mask layer with a high selectivity formed after the bit line etching is directly used for etching to form the capacitor connecting line, without manufacturing SOD, thereby reducing the manufacturing difficulty and the manufacturing cost. In addition, due to the high selectivity of silicon oxide and silicon nitride, using silicon oxide as the mask can improve the effect of etching silicon nitride, and it is easier to obtain the etched complete first isolation structures and second isolation structures, thus directly forming capacitor connecting lines. Short circuit of capacitor connecting lines which is prone to occur during etching can be resolved by using smaller critical dimension line width.

The reference numerals and structure names in FIG. 1 to FIG. 10C are:

semiconductor substrate 100, through hole filler 101, first dielectric layer 102, first metal conductive layer 103, second metal conductive layer 104, second dielectric layer 105, mask layer 106, isolation layer 107, sacrificial layer 108, hard mask 109, third dielectric layer 110, first photolithography anti-reflective layer 111, second photolithography anti-reflective layer 112, photolithography exposure layer 113, sidewall dielectric layer 114, capacitor connecting line insulating layer 115.

In an embodiment, for example, the through hole filler 101 may be made of a polycrystalline silicon material and/or a monocrystalline silicon material.

In an embodiment, for example, the first dielectric layer 102 may be made of silicon nitride.

In an embodiment, for example, the first metal conductive layer 103 may be made of titanium nitride and/or titanium metal.

In an embodiment, for example, the second metal conductive layer 104 may be made of metal tungsten/tungsten silicide.

In an embodiment, for example, the second dielectric layer 105 may be made of silicon nitride.

In an embodiment, for example, the mask layer 106 may be made of silicon oxide.

In an embodiment, for example, the isolation layer 107 may be made of silicon nitride.

In an embodiment, for example, the sacrificial layer 108 may be made of silicon oxide or SOD.

In an embodiment, for example, the hard mask 109 may be made of carbon.

In an embodiment, for example, the third dielectric layer 110 may be made of silicon nitride or silicon oxynitride.

In an embodiment, for example, the first photolithography anti-reflective layer 111 may be made of spin on carbon (SOC).

In an embodiment, for example, the second photolithography anti-reflective layer 112 may be made of SOC with silicon.

In an embodiment, for example, the photolithography exposure layer 113 may be made of positive photoresist and/or negative photoresist.

In an embodiment, for example, the sidewall dielectric layer 114 may be made of silicon oxide.

In an embodiment, for example, the capacitor connecting line insulating layer 115 may be made of silicon nitride.

Figure 2:
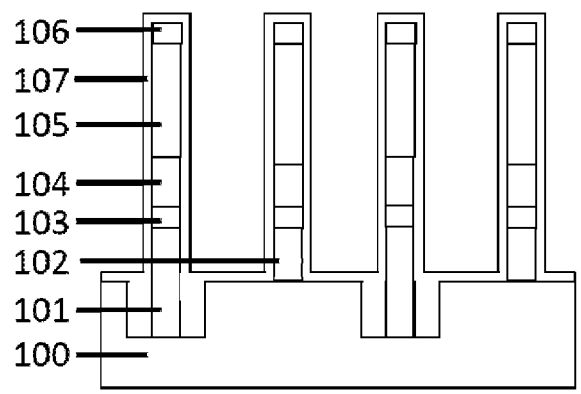
FIG. 2 is a schematic diagram of a capacitor connecting line of another memory according to an embodiment of the present disclosure.
Figure 3A:
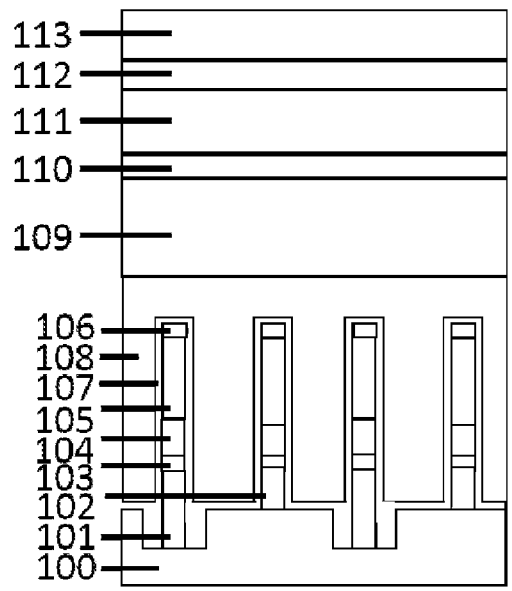
FIG. 3A is a schematic diagram of a capacitor connecting line of another memory according to an embodiment of the present disclosure.
Figure 3B:
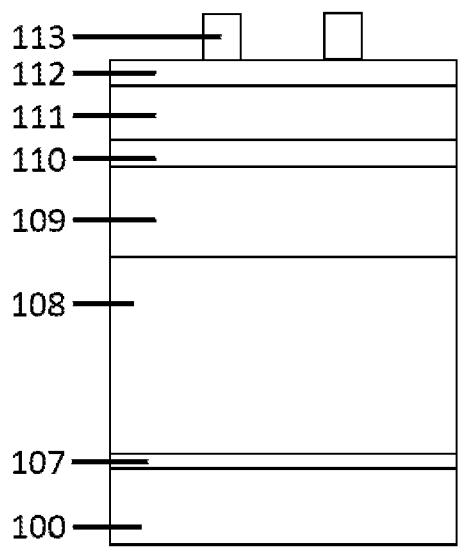
FIG. 3B is a schematic diagram of a capacitor connecting line of yet another memory according to an embodiment of the present disclosure.
Figure 4A:
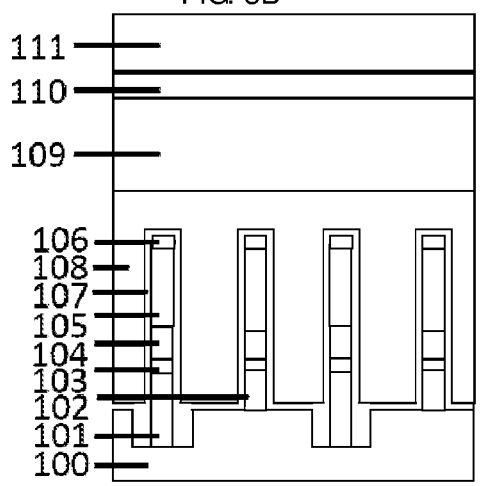
FIG. 4A is a schematic diagram of a capacitor connecting line of another memory according to an embodiment of the present disclosure.
Figure 4B:
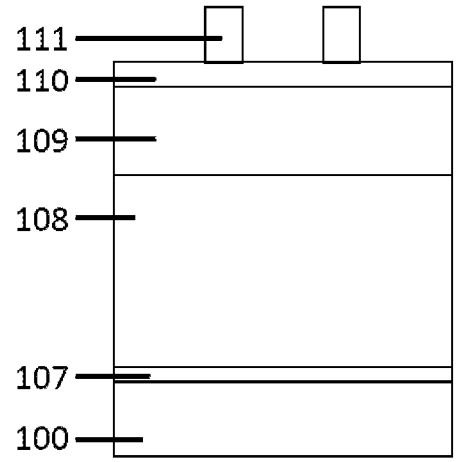
FIG. 4B is a schematic diagram of a capacitor connecting line of another memory according to an embodiment of the present disclosure.
Figure 5A:
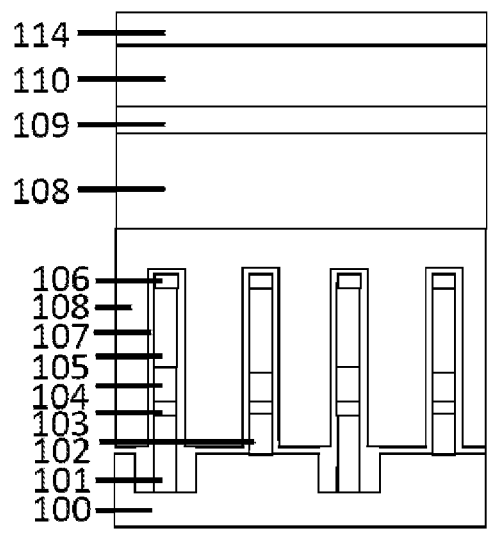
FIG. 5A is a schematic diagram of a capacitor connecting line of yet another memory according to an embodiment of the present disclosure.
Figure 5B:
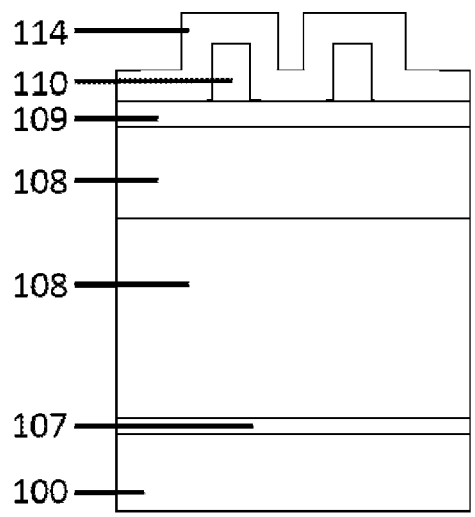
FIG. 5B is a schematic diagram of a capacitor connecting line of another memory according to an embodiment of the present disclosure.

FIG. 1 to FIG. 10C are a method of manufacturing a capacitor connecting line. FIG. 1 and FIG. 2 are structures after a bit line is formed, including a first metal conductive layer 103, a second metal conductive layer 104, a second dielectric layer 105, a mask layer 106, and so on. The mask layer needs to be removed during the process of manufacturing the capacitor connecting line.

FIG. 3A, FIG. 3B, FIG. 4A, FIG. 4B, FIG. 5A, FIG. 5B, FIG. 6A, and FIG. 6B are a process of forming a pattern mask for the capacitor connecting line, including photolithography, etching, atomic layer deposition and etching, and the like. A double patterning process is required.

Figure 6A:
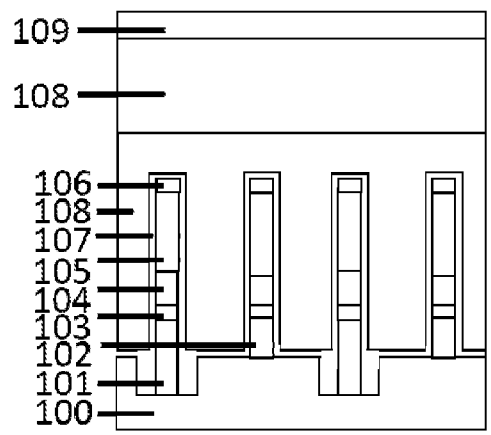
FIG. 6A is a schematic diagram of a capacitor connecting line of another memory according to an embodiment of the present disclosure.
Figure 6B:
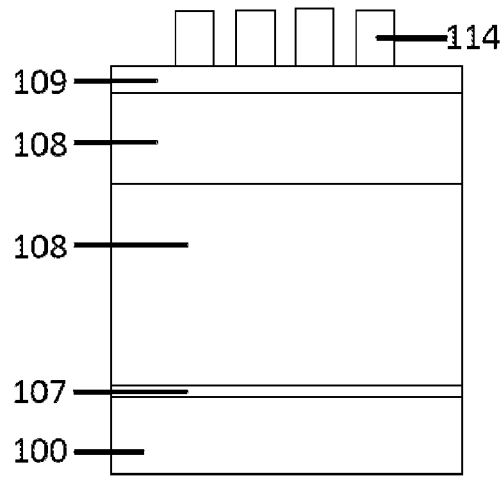
FIG. 6B is a schematic diagram of a capacitor connecting line of yet another memory according to an embodiment of the present disclosure.
Figure 7A:
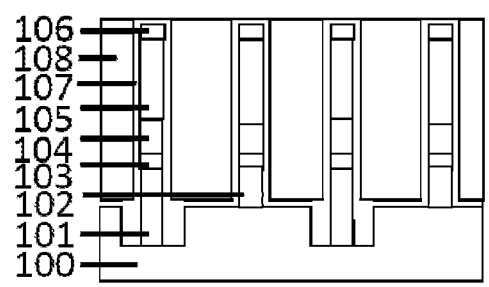
FIG. 7A is a schematic diagram of a capacitor connecting line of another memory according to an embodiment of the present disclosure.
Figure 7B:
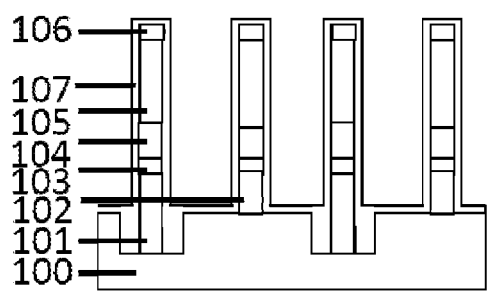
FIG. 7B is a schematic diagram of a capacitor connecting line of yet another memory according to an embodiment of the present disclosure.
Figure 7C:
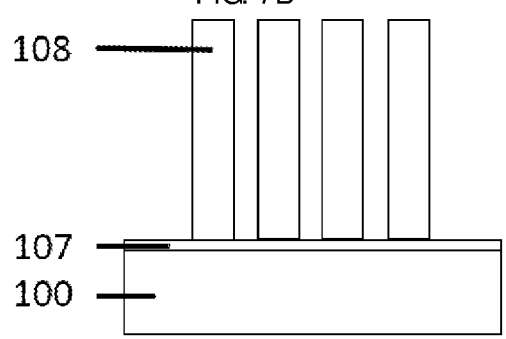
FIG. 7C is a schematic diagram of a capacitor connecting line of another memory according to an embodiment of the present disclosure.
Figure 8A:
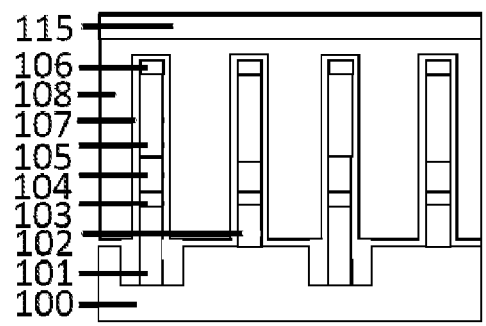
FIG. 8A is a schematic diagram of a capacitor connecting line of another memory according to an embodiment of the present disclosure.
Figure 8B:
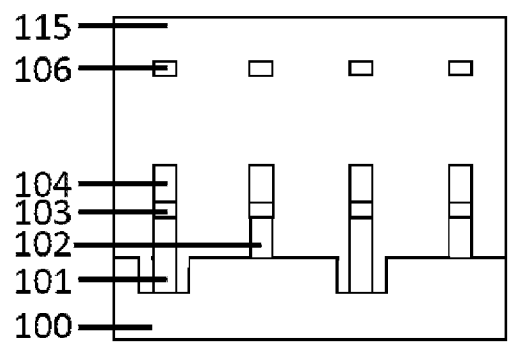
FIG. 8B is a schematic diagram of a capacitor connecting line of yet another memory according to an embodiment of the present disclosure.
Figure 8C:
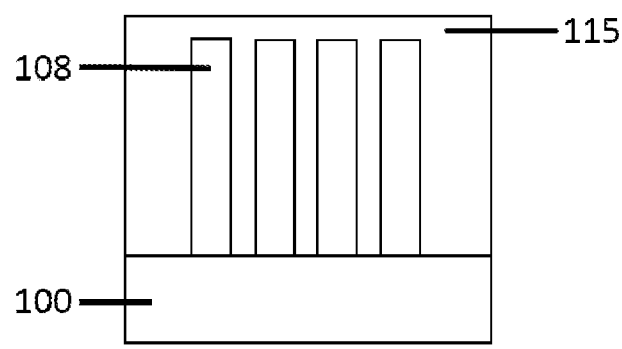
FIG. 8C is a schematic diagram of a capacitor connecting line of another memory according to an embodiment of the present disclosure.
Figure 9A:
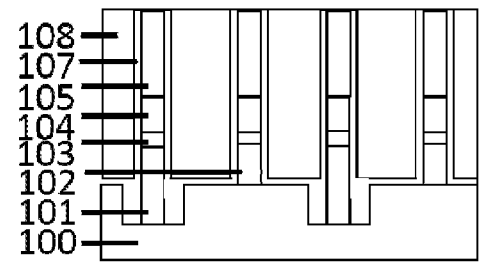
FIG. 9A is a schematic diagram of a capacitor connecting line of another memory according to an embodiment of the present disclosure.
Figure 9B:
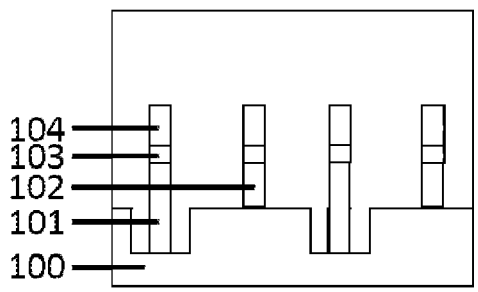
FIG. 9B is a schematic diagram of a capacitor connecting line of yet another memory according to an embodiment of the present disclosure.
Figure 9C:
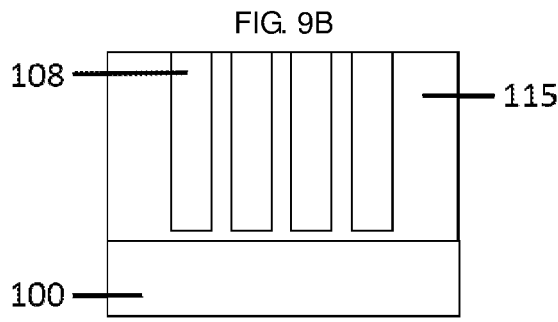
FIG. 9C is a schematic diagram of a capacitor connecting line of another memory according to an embodiment of the present disclosure.
Figure 10A:
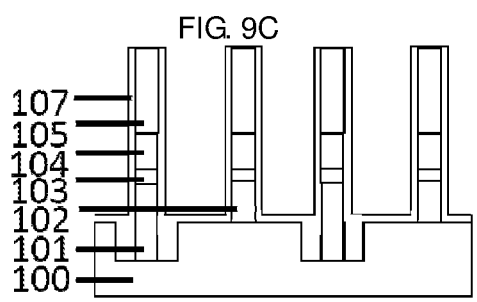
FIG. 10A is a schematic diagram of a capacitor connecting line of another memory according to an embodiment of the present disclosure.
Figure 10B:
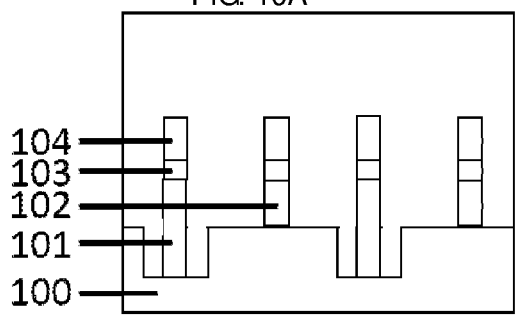
FIG. 10B is a schematic diagram of a capacitor connecting line of yet another memory according to an embodiment of the present disclosure.
Figure 10C:
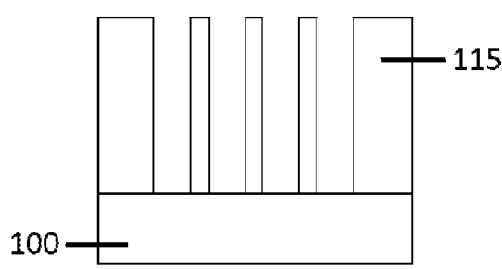
FIG. 10C is a schematic diagram of a capacitor connecting line of yet another memory according to an embodiment of the present disclosure.
Figure 11A:
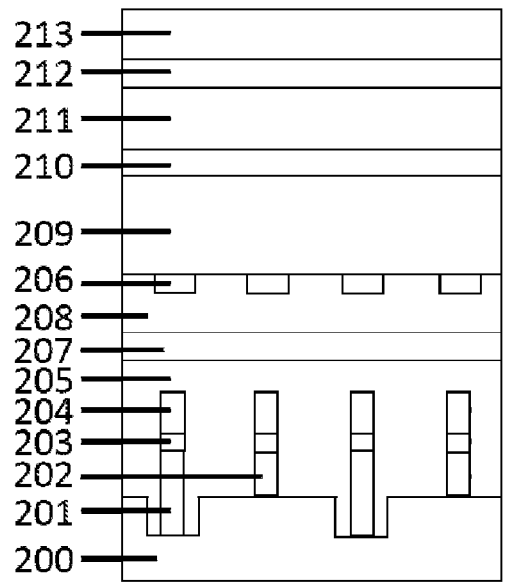
FIG. 11A is a schematic diagram of a capacitor connecting line of another memory according to an embodiment of the present disclosure.
Figure 11B:
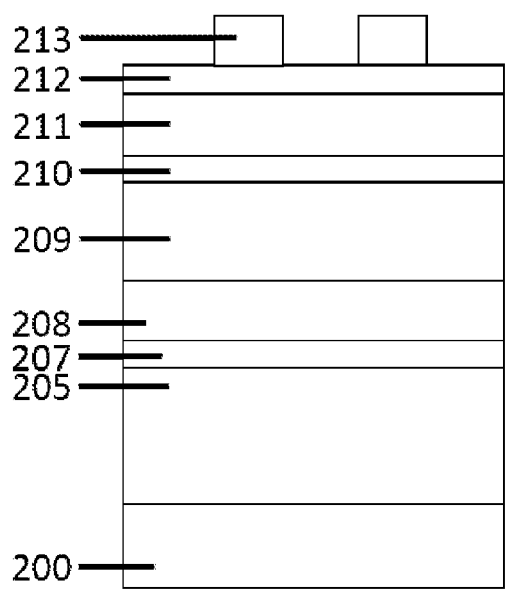
FIG. 11B is a schematic diagram of a capacitor connecting line of yet another memory according to an embodiment of the present disclosure.
Figure 12A:
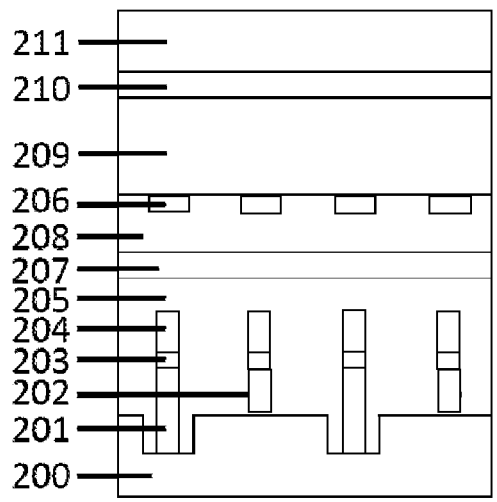
FIG. 12A is a schematic diagram of a capacitor connecting line of another memory according to an embodiment of the present disclosure.
Figure 12B:
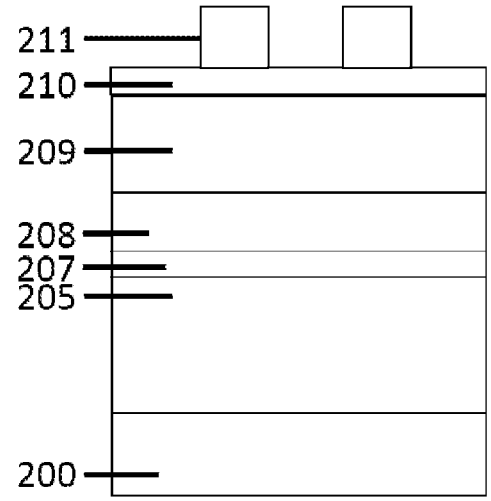
FIG. 12B is a schematic diagram of a capacitor connecting line of another memory according to an embodiment of the present disclosure.

Through a large number of memory manufacturing experiments, the inventor found that as shown in FIG. 6A and FIG. 6B, the critical dimension of the sidewall dielectric layer 114 determines the width of the capacitor connecting line. Therefore, the critical dimension of the sidewall dielectric layer 114 needs to be as large as possible. However, the excessively large sidewall dielectric layer 114 will cause incomplete etched isolation structures, which will lead to short circuit of the capacitor connecting lines.

Figure 18A:
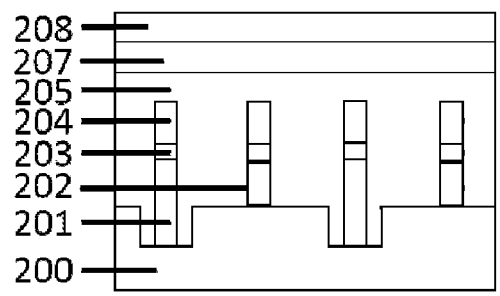
FIG. 18A is a schematic diagram of a capacitor connecting line of another memory according to an embodiment of the present disclosure.
Figure 18B:
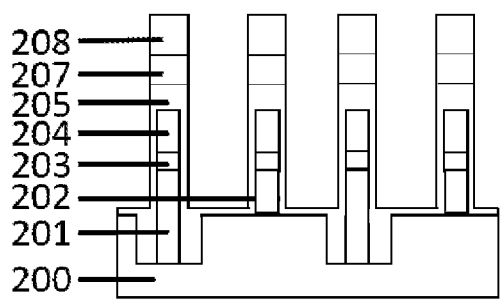
FIG. 18B is a schematic diagram of a capacitor connecting line of yet another memory according to an embodiment of the present disclosure.
Figure 18C:
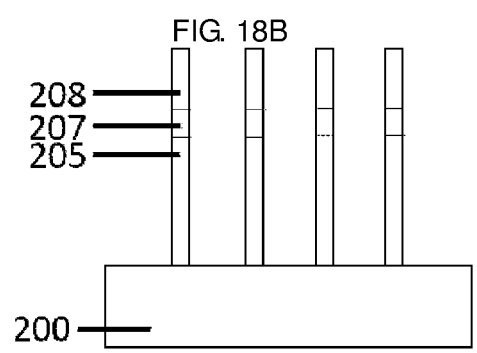
FIG. 18C is a schematic diagram of a capacitor connecting line of yet another memory according to an embodiment of the present disclosure.
Figure 18D:
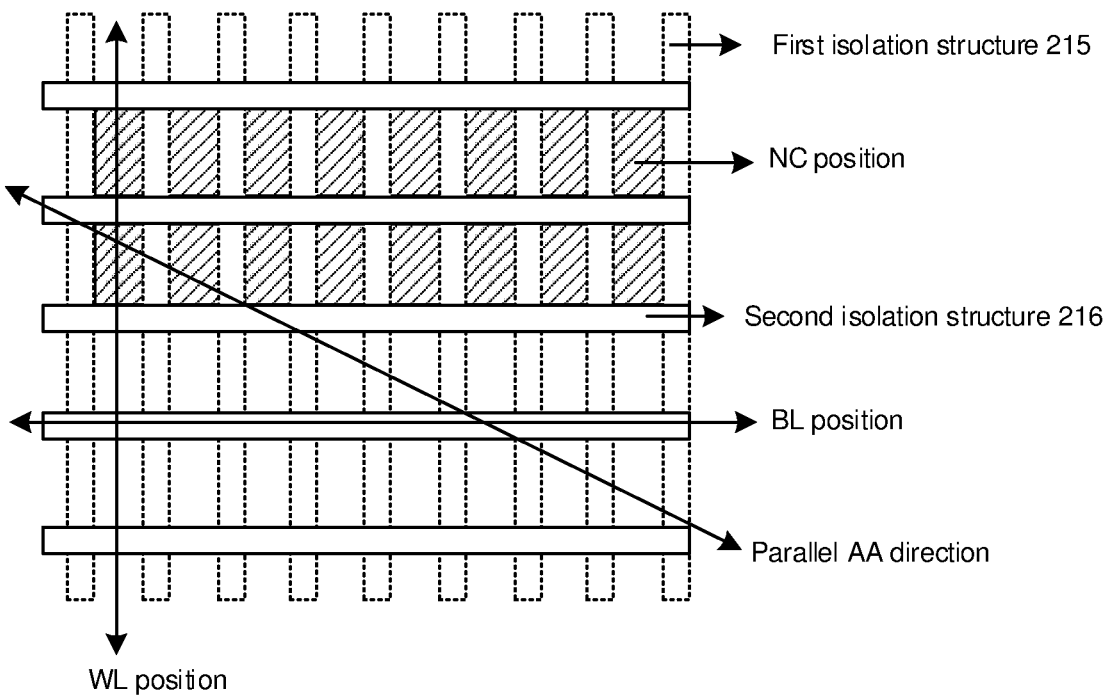
FIG. 18D is a schematic top view of a slice position of a capacitor connecting line of a memory according to an embodiment of the present disclosure.

Referring to a WL position, an NC position, a BL position and a parallel AA direction shown in FIG. 18D, the substrate is sliced to obtain cross-sectional images of the memory of the present disclosure at multiple angles.

FIG. 7A, FIG. 7B, FIG. 7C, FIG. 8A, FIG. 8B, FIG. 8C, FIG. 9A, FIG. 9B, FIG. 9C, FIG. 10A, FIG. 10B and FIG. 10C are a process of forming the final capacitor connecting line. Further, referring to FIG. 9A, FIG. 9B and FIG. 9C, it can be seen that the sacrificial layer 108 is completely removed, which causes great waste to the high process cost of the sacrificial layer 108.

The solutions provided in the embodiments of the present disclosure relates to the memory manufacturing technology, which is specifically described by the following embodiments.

Next, steps of the method of manufacturing a capacitor connecting line of a memory in this exemplary implementation are described in more detail with reference to FIG. 11A to FIG. 20 and the embodiments.

The reference numerals and structure names in FIG. 11A to FIG. 18D are:

semiconductor substrate 200, through hole filler 201, first silicon nitride layer 202, first metal conductive layer 203, second metal conductive layer 204, silicon nitride layer 205, dielectric structure, isolation layer 207, silicon nitride insulating layer 208, carbon mask layer 209, second dielectric layer 210, first photolithography anti-reflective layer 211, second photolithography anti-reflective layer 212, photoresist layer 213, oxide sidewall 214, first isolation structure 215, and second isolation structure 216.

The first photolithography anti-reflective layer 211 may be an SOC material layer, and the second photolithography anti-reflective layer 212 may be an SOC with silicon material layer.

Figure 19:
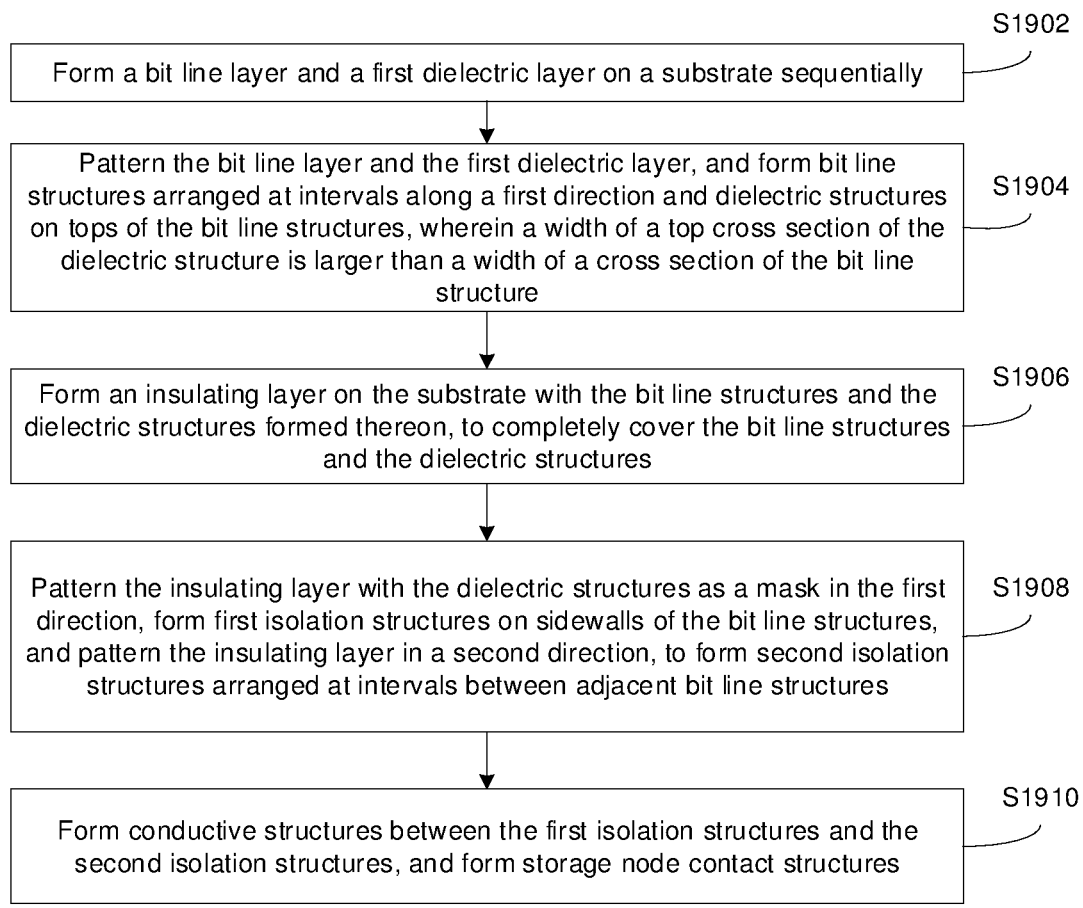
FIG. 19 is a flowchart of a method of manufacturing a capacitor connecting line of a memory according to an embodiment of the present disclosure.

As shown in FIG. 19, this embodiment provides a method of manufacturing a capacitor connecting line of a memory, including:

Step S1902: Form a bit line layer and a first dielectric layer on a substrate sequentially.

In the foregoing embodiment, as shown in FIG. 11A, FIG. 11B, FIG. 12A, FIG. 12B, FIG. 13A, FIG. 13B, FIG. 14A, FIG. 14B, FIG. 15A, FIG. 15B, FIG. 15C, FIG. 16A, FIG. 16B, FIG. 16C, FIG. 17A, FIG. 17B, FIG. 17C, FIG. 18A, FIG. 18B and FIG. 18C, the through hole filler 201, the first silicon nitride layer 202, the first metal conductive layer 203, the second metal conductive layer 204, the silicon nitride layer 205, the dielectric structure and the isolation layer 207 are formed on the semiconductor substrate 200.

In an embodiment, for example, the through hole filler 201 may be made of a polycrystalline silicon material and/or a monocrystalline silicon material.

In an embodiment, for example, the first metal conductive layer 203 may be made of titanium nitride and/or titanium metal.

In an embodiment, for example, the second metal conductive layer 204 may be made of metal tungsten/tungsten silicide.

In an embodiment, for example, the first dielectric layer may be a silicon nitride layer 205.

In an embodiment, for example, the oxide mask layer 206 may be made of silicon oxide.

In an embodiment, for example, the isolation layer 207 may be made of silicon nitride.

In an embodiment, for example, the silicon nitride insulating layer 208 may be made of silicon nitride or SOD.

In an embodiment, for example, the hard mask may be a carbon mask layer 209.

In an embodiment, for example, the second dielectric layer 210 may be made of silicon nitride or silicon oxynitride.

In an embodiment, for example, the first photolithography anti-reflective layer 211 may be made of SOD.

In an embodiment, for example, the second photolithography anti-reflective layer 212 may be made of SOC with silicon.

In an embodiment, for example, the photoresist layer 213 may be made of positive photoresist and/or negative photoresist.

In an embodiment, for example, the oxide sidewall 214 may be made of silicon oxide.

The bit line layer includes a conductive structure composed of the through hole filler 201, the first metal conductive layer 203 and the second metal conductive layer 204. For example, the through hole filler 201 may be made of polycrystalline silicon, the first metal conductive layer 203 may be made of titanium nitride/titanium metal, and the second metal conductive layer 204 may be made of metal tungsten/tungsten silicide.

The first dielectric layer includes the silicon nitride layer 205.

The silicon nitride layer 205 and the isolation layer 207 are two silicon nitride forming steps, and there are differences in process methods and parameters. Compared with the silicon nitride layer 205, the isolation layer 207 has higher density.

In addition, the first direction is the WL direction, the second direction is the BL direction, and the first direction and the second direction are perpendicular to each other.

Step S1904: Pattern the bit line layer and the first dielectric layer, and form bit line structures arranged at intervals along a first direction and dielectric structures on tops of the bit line structures, wherein a width of a top cross section of the dielectric structure is larger than a width of a cross section of the bit line structure.

Step S1906: Form an insulating layer on the substrate with the bit line structures and the dielectric structures formed thereon, wherein the insulating layer includes a material layer with the same material as the first dielectric layer. In some embodiments, the insulating layer may include a silicon nitride layer 205, and an isolation layer 207 and a silicon nitride insulating layer 208 located above the silicon nitride layer 205.

A thickness of the insulating layer on the sidewall of the bit line structure may be determined by the width of the dielectric structure.

In the foregoing embodiment, the second dielectric layer 210 may include a silicon nitride layer and/or a silicon oxynitride layer.

Step S1908: As shown in FIG. 18D, pattern the insulating layer with the dielectric structures as a mask in the first direction, form first isolation structures 215 on sidewalls of the bit line structures, and pattern the insulating layer in a second direction, to form second isolation structures 216 arranged at intervals between adjacent bit line structures.

In the foregoing embodiment, oxide sidewalls 214 are formed on the mask layer at corresponding positions above the bit line layer, and a thickness of the isolation layer in a non-contact (NC) area between bit line structures is mainly determined by a line width of the oxide sidewall 214. Since the vertical rate of dry etching the silicon oxide is much higher than the horizontal rate, the oxide sidewall 214 may be made of silicon oxide material, to minimize the line width of the oxide sidewall 214.

The through hole filler 201 shown in FIG. 11A, FIG. 11B, FIG. 12A, FIG. 13A, FIG. 14A, FIG. 15A, FIG. 15B, FIG. 16A, FIG. 17A, FIG. 17B, FIG. 18A and FIG. 18B is a semiconductor conductive material. Therefore, any two bit line structures must be isolated from each other, and the oxide sidewall 214 serves as an isolation between them.

In the foregoing embodiment, the pattern is transferred to the carbon mask layer 209 and the second dielectric layer 210 by using the oxide sidewalls 214 as a mask. The height of the carbon mask layer 209 is higher, such that the etching of the first dielectric layer can be well completed by using this mask.

In some embodiments, dry etching is usually used to etch the silicon nitride insulating layer, which mainly uses gases such as $CF_4$, $CH_2F_2$ and He. When the carbon mask layer 209 is etched, the selectivity of the second dielectric layer 210 is extremely high, and the second dielectric layer 210 is hardly etched. In addition, when etching the silicon nitride insulating layer, the selectivity of the carbon mask layer 209 and the second dielectric layer 210 ranges from 2:1 to 1:2.

Step S1910: Form conductive structures between the first isolation structures and the second isolation structures, and form storage node contact structures.

In the foregoing embodiment, the hard mask layer is removed through dry etching, and the hard mask layer may be the carbon mask layer 209. The dry etching mainly uses O2, whose flow range is 300 sccm-500 sccm and a voltage range is 1,500 w to 2,500 w.

In conclusion, the dielectric structures on tops of the bit line structures are formed on the substrate with the bit line layer formed thereon; the insulating layer is patterned with the dielectric structures as a mask; the first isolation structures are formed on the sidewalls of the bit line structures; and the insulating layer is patterned in the second direction, to form the second isolation structures arranged at intervals between adjacent bit line structures. By using a high selectivity, the capacitor connecting line can be directly etched and formed, without manufacturing SOD, thereby reducing the manufacturing difficulty and the manufacturing cost.

Figure 15A:
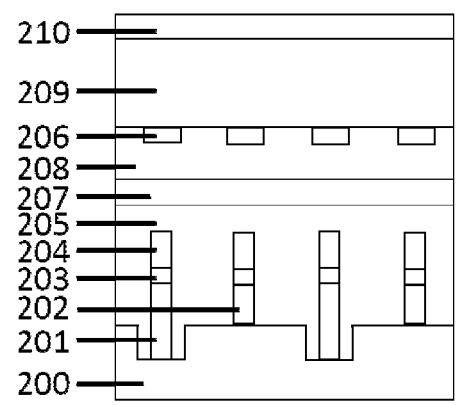
FIG. 15A is a schematic diagram of a capacitor connecting line of another memory according to an embodiment of the present disclosure.
Figure 15B:
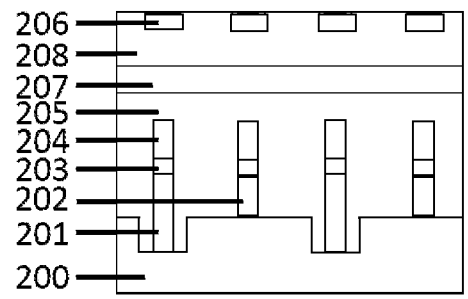
FIG. 15B is a schematic diagram of a capacitor connecting line of yet another memory according to an embodiment of the present disclosure.

In an embodiment of the present disclosure, as shown in FIG. 15B, after the patterning the bit line layer and the first dielectric layer, and forming bit line structures arranged at intervals along a first direction and dielectric structures on tops of the bit line structures, the insulating layer is formed on the substrate through a deposition process, wherein the insulating layer includes the silicon nitride layer 205, the isolation layer 207 and the silicon nitride insulating layer 208 that are sequentially stacked; a oxide mask layer 206 patterned is formed on an upper surface of the silicon nitride insulating layer 208, to form the oxide mask layer 206 with a same pattern as the dielectric structures; the silicon nitride insulating layer 208 with the oxide mask layer 206 formed thereon is planarized.

In the foregoing embodiments, the insulating layer is formed on the substrate through the deposition process, to fill gaps between different bit line structures, so as to realize electrical isolation between the bit line structures. In addition, the insulating layer is planarized, such that an upper surface of the insulating layer and an upper surface of the oxide mask layer 206 form a same plane, and then the structure layer is deposited on the upper surfaces. This helps reduce the film stress on the semiconductor substrate 200.

Figure 13A:
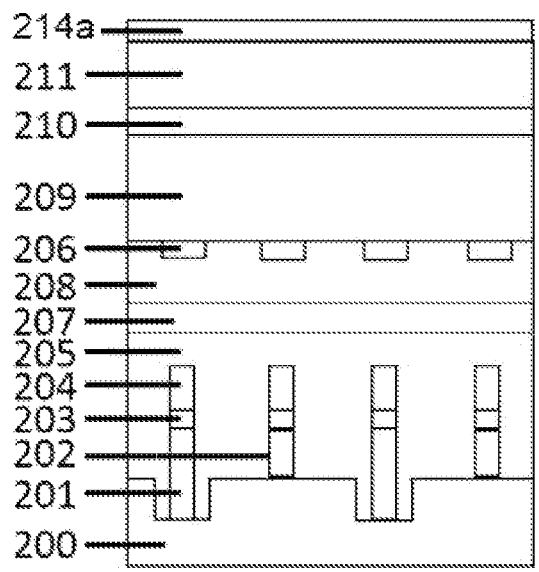
FIG. 13A is a schematic diagram of a capacitor connecting line of yet another memory according to an embodiment of the present disclosure.
Figure 13B:
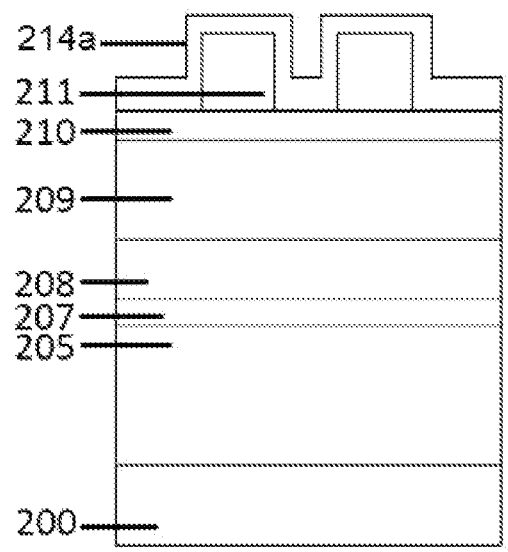
FIG. 13B is a schematic diagram of a capacitor connecting line of another memory according to an embodiment of the present disclosure.

In an embodiment of the present disclosure, as shown in FIG. 13A and FIG. 13B, the patterning the bit line layer and the first dielectric layer, and forming bit line structures arranged at intervals along a first direction and dielectric structures on tops of the bit line structures further includes: forming a carbon mask layer 209 and a second dielectric layer 210 sequentially through a deposition process on the upper surface of the insulating layer planarized, wherein the second dielectric layer 210 includes a silicon nitride layer and/or a silicon oxynitride layer.

In the above embodiment, the carbon mask layer 209 and the second dielectric layer 210 are sequentially formed through the deposition process on the upper surface of the insulating layer, to form the mask layer. A composite hard mask layer is formed for subsequent etching of the oxide sidewalls 214.

Figure 14A:
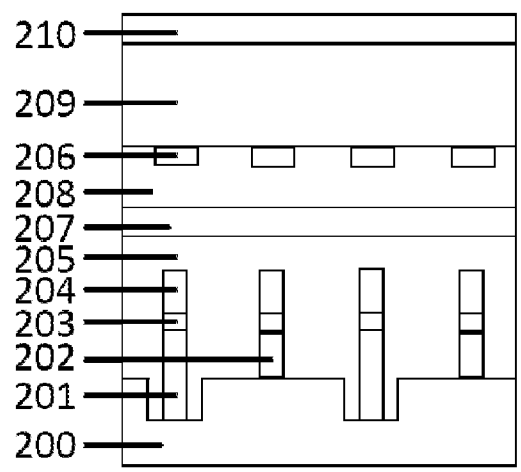
FIG. 14A is a schematic diagram of a capacitor connecting line of another memory according to an embodiment of the present disclosure.
Figure 14B:
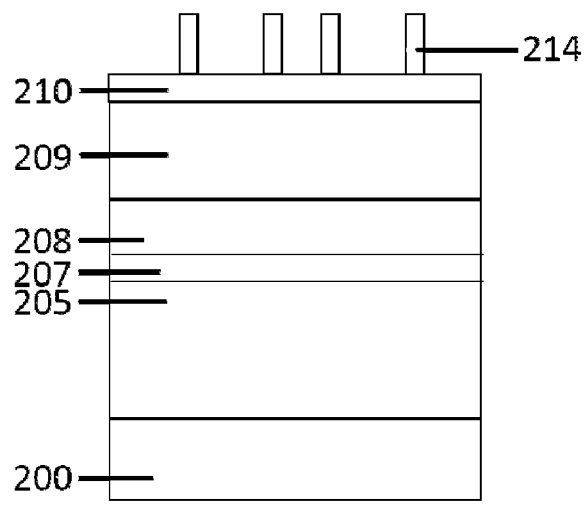
FIG. 14B is a schematic diagram of a capacitor connecting line of yet another memory according to an embodiment of the present disclosure.

In an embodiment of the present disclosure, before the patterning the insulating layer with the dielectric structures as a mask in the first direction, forming first isolation structures on sidewalls of the bit line structures, and patterning the insulating layer in a second direction, to form second isolation structures arranged at intervals between adjacent bit line structures, the method further includes: forming a photolithography coating on the second dielectric layer 210, wherein the photolithography coating includes a photolithography anti-reflective layer and a photoresist layer 213, and the photolithography anti-reflective layer may be, for example, the first photolithography anti-reflective layer 211 and the second photolithography anti-reflective layer 212; performing photolithography treatment on the photolithography coating to obtain a photolithography material sacrificial layer patterned; as shown in FIG. 13A and FIG. 13B, forming a silicon oxide layer 214a on the photolithography material sacrificial layer and the second dielectric layer 210 through a deposition process; etching the silicon oxide layer 214a through a dry etching process to obtain a photolithography anti-reflective layer and a sidewall of the photolithography anti-reflective layer; and as shown in FIG. 14A and FIG. 14B, the photolithography anti-reflective layer is removed by oxide gas, to obtain the oxide sidewalls 214 of the bit line structures.

Figure 15C:
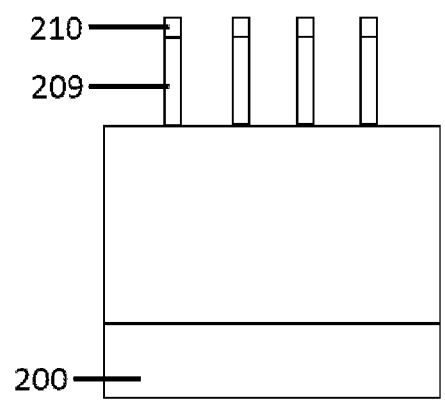
FIG. 15C is a schematic diagram of a capacitor connecting line of another memory according to an embodiment of the present disclosure.
Figure 16A:
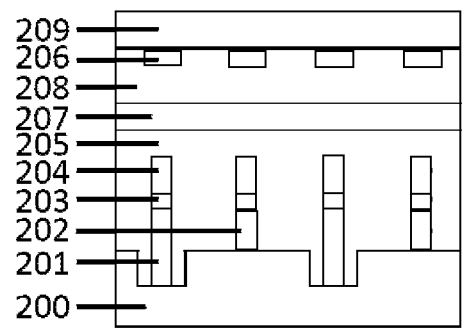
FIG. 16A is a schematic diagram of a capacitor connecting line of another memory according to an embodiment of the present disclosure.
Figure 16B:
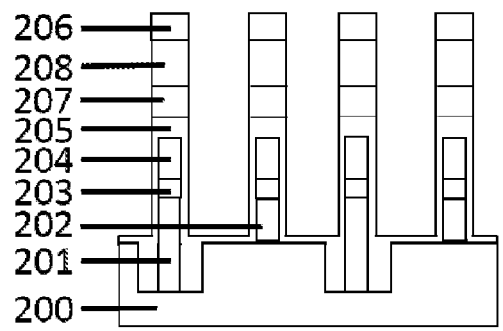
FIG. 16B is a schematic diagram of a capacitor connecting line of yet another memory according to an embodiment of the present disclosure.
Figure 16C:
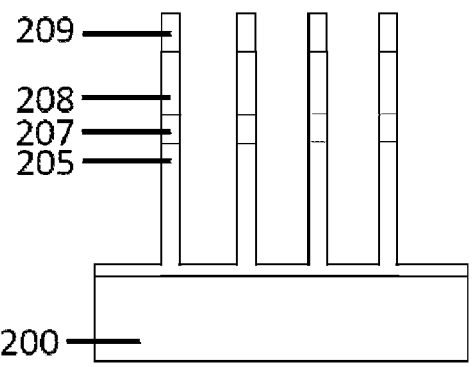
FIG. 16C is a schematic diagram of a capacitor connecting line of another memory according to an embodiment of the present disclosure.

In an embodiment of the present disclosure, as shown in FIG. 15A, FIG. 15B and FIG. 15C, the forming conductive structures between the first isolation structures and the second isolation structures, and forming storage node contact structures includes: etching the second dielectric layer 210 and the carbon mask layer 209 with the oxide sidewalls 214 as a mask and removing the oxide sidewalls 214, to obtain a patterned carbon mask layer and the second dielectric layer 210; as shown in FIG. 16A, FIG. 16B and FIG. 16C, performing dry etching on the insulating layer with the patterned carbon mask layer and the dielectric structures as a mask until the substrate is exposed.

In an embodiment of the present disclosure, an etching ratio of the dielectric structures and the insulating layer by dry etching ranges from 1:7 to 1:15.

Figure 17A:
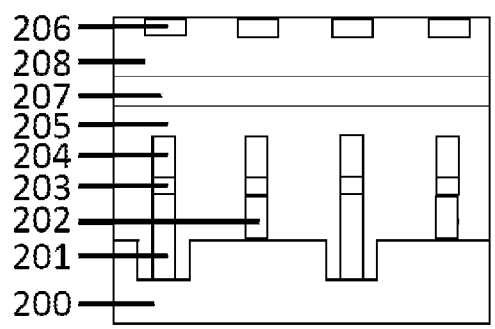
FIG. 17A is a schematic diagram of a capacitor connecting line of another memory according to an embodiment of the present disclosure.
Figure 17B:
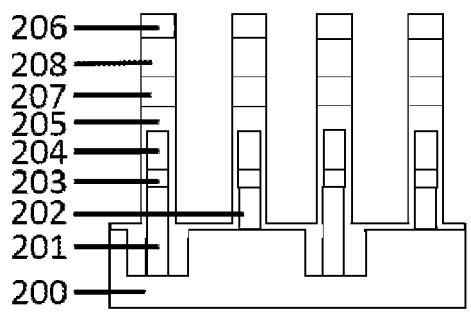
FIG. 17B is a schematic diagram of a capacitor connecting line of yet another memory according to an embodiment of the present disclosure.
Figure 17C:
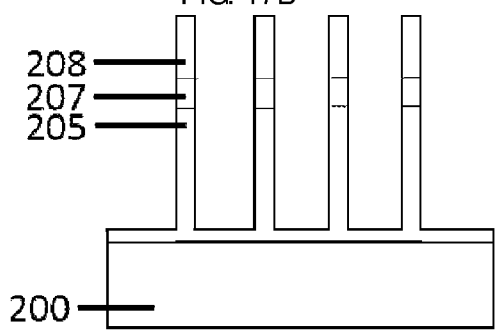
FIG. 17C is a schematic diagram of a capacitor connecting line of another memory according to an embodiment of the present disclosure.

In an embodiment of the present disclosure, removing the mask layer to obtain the capacitor connecting line coated with the silicon nitride insulating layer includes: as shown in FIG. 17A, FIG. 17B and FIG. 17C, removing the carbon mask layer 209 through a dry etching process; and as shown in FIG. 18A, FIG. 18B and FIG. 18C, removing the oxide mask layer 206 through a dry etching process, to obtain the capacitor connecting line coated with the insulating layer.

In an embodiment of the present disclosure, when the oxide mask layer 206 is removed through the dry etching process, an etching ratio of the oxide mask layer 206 and the insulating layer is greater than or equal to 1:1.

In an embodiment of the present disclosure, a film thickness of the insulating layer is 80 nm to 120 nm, and/or a film thickness of the carbon mask layer 209 is 80 nm to 130 nm, and a film thickness of the second dielectric layer 210 is 25 nm to 45 nm.

Figure 20:
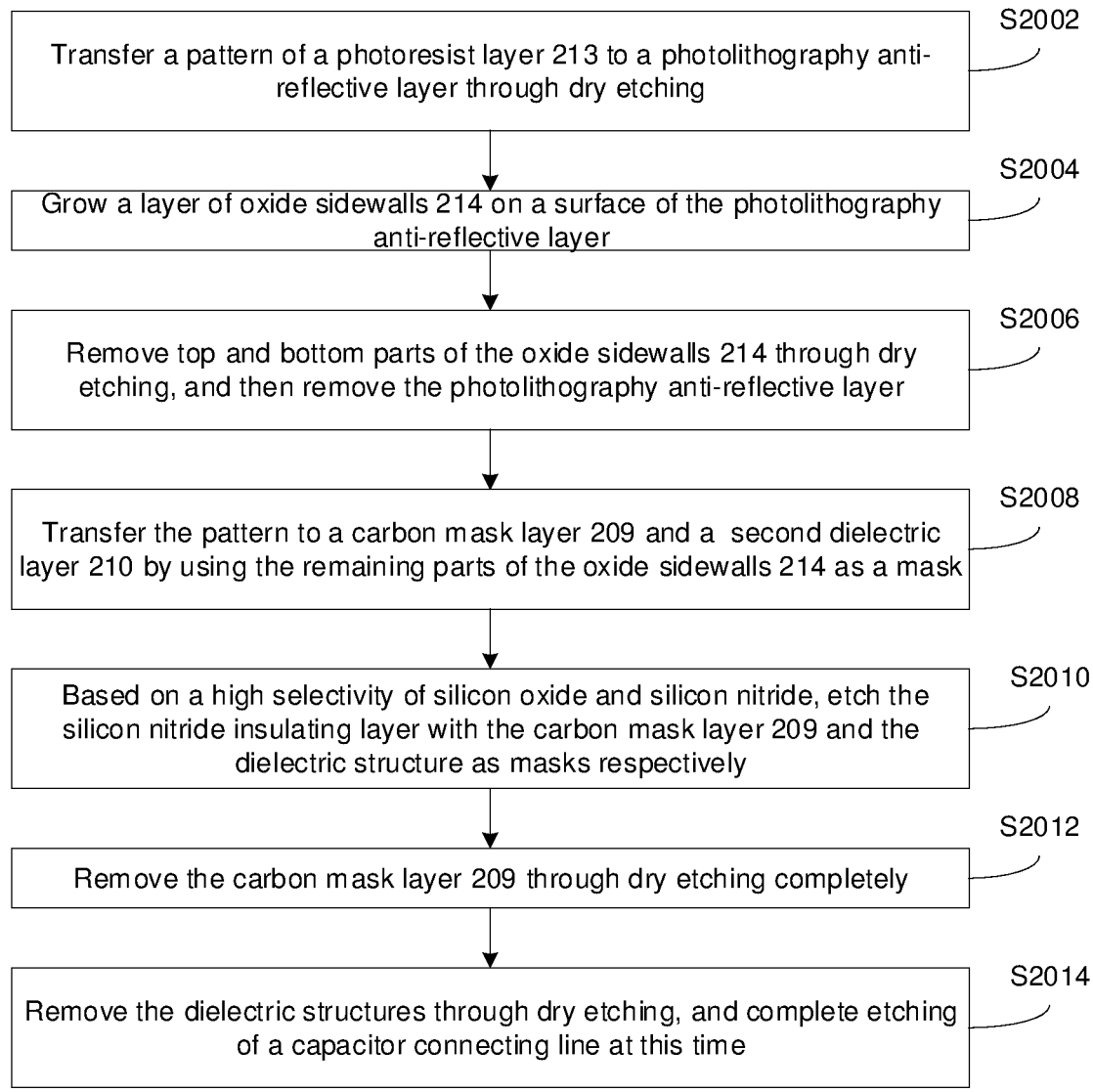
FIG. 20 is a flowchart of another method of manufacturing a capacitor connecting line of a memory according to an embodiment of the present disclosure.

As shown in FIG. 20, an embodiment provides another method of manufacturing a capacitor connecting line of a memory, including:

Step S2002: Transfer a pattern of a photoresist layer 213 to a photolithography anti-reflective layer through dry etching.

Step S2004: Grow a layer of oxide sidewalls 214 on a surface of the photolithography anti-reflective layer.

Step S2006: Remove top and bottom parts of the oxide sidewalls 214 through dry etching, and then remove the photolithography anti-reflective layer, wherein the remaining parts of the oxide sidewalls 214 are used as a mask to etch a lower film.

Step S2008: Transfer the pattern to a carbon mask layer 209 and a second dielectric layer 210 by using the remaining parts of the oxide sidewalls 214 as a mask. The height of the carbon mask layer 209 is higher, such that the etching of a silicon nitride insulating layer can be well completed by using the carbon mask layer 209 as a barrier. The silicon nitride insulating layer is an example of the insulating layer, but the insulating layer is not limited hereto.

Step S2010: Based on a high selectivity of silicon oxide and silicon nitride, etch the silicon nitride insulating layer with the patterned carbon mask layer and the dielectric structure as masks respectively.

Step S2012: Remove the carbon mask layer 209 completely through dry etching.

Step S2014: Remove the dielectric structures through dry etching, and complete etching of the capacitor connecting line at this time. It should be noted that the selectivity for etching the dielectric structures and the silicon nitride insulating layer is close to 1:1, to ensure the flatness of the silicon nitride insulating layer.

An exemplary embodiment of the present disclosure further provides a memory, wherein the memory can be manufactured through the method of manufacturing a capacitor connecting line of a memory described above.

The embodiments or implementations of this specification are described in a progressive manner, and each embodiment focuses on differences from other embodiments. The same or similar parts between the embodiments may refer to each other.

An exemplary embodiment of the present disclosure further provides a computer readable storage medium, where the computer readable storage medium stores a program product that can be used to implement the method in the specification. In some possible embodiments, various aspects of the present disclosure may also be realized in the form of a program product, which includes program code. When the program product runs on a terminal device, the program code is used to enable the terminal device to perform the steps according to various exemplary embodiments of the present disclosure described in the foregoing "exemplary methods" of this specification.

In the description of the specification, the description with reference to terms such as "an embodiment", "an exemplary embodiment", "some implementations", "a schematic implementation" and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one element from another.

The same elements in one or more accompanying drawings are denoted by similar reference numerals. For the sake of clarity, various parts in the accompanying drawings are not drawn to scale. In addition, some well-known parts may not be shown. For the sake of brevity, the structure obtained by implementing a plurality of steps may be shown in one figure. In order to make the understanding of the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

According to the method of manufacturing a capacitor connecting line of a memory and the memory provided in the embodiments of the present disclosure, the mask layer formed after the bit line etching has a high selectivity, and therefore, can be directly used for etching and forming the capacitor connecting line, without manufacturing a sacrifice of dielectric layer (SOD), thereby reducing the manufacturing difficulty and the manufacturing cost. In addition, due to the high selectivity of silicon oxide and silicon nitride, silicon oxide can be used as a mask to directly etch silicon nitride to form more complete isolation structures, thus directly forming capacitor connecting lines. Finally, short circuit of capacitor connecting lines which is prone to occur during etching can be resolved by using smaller critical dimension line width.

The invention claimed is:

1. A method of manufacturing a capacitor connecting line of a memory, comprising:
    forming a bit line layer and a first dielectric layer on a substrate sequentially;
    patterning the bit line layer and the first dielectric layer, and forming bit line structures arranged at intervals along a first direction and dielectric structures on tops of the bit line structures, wherein a width of a top cross section of the dielectric structures is larger than a width of a cross section of the bit line structures;
    forming an insulating layer on the substrate with the bit line structures and the dielectric structures formed thereon, to completely cover the bit line structures and the dielectric structures;
    patterning the insulating layer with the dielectric structures as a mask in the first direction, forming first isolation structures on sidewalls of the bit line structures, and patterning the insulating layer in a second direction, to form second isolation structures arranged at intervals between adjacent bit line structures; and
    forming conductive structures between the first isolation structures and the second isolation structures, and forming storage node contact structures.

2. The method of manufacturing a capacitor connecting line of a memory according to claim 1, after the forming an insulating layer on the substrate with the bit line structures and the dielectric structures formed thereon, the method further comprises:
    forming an oxide mask layer on the insulating layer; and
    patterning the oxide mask layer, to form a same pattern as the dielectric structures in the insulating layer, wherein the insulating layer comprises a silicon nitride layer, an isolation layer and a silicon nitride insulating layer stacked sequentially.

3. The method of manufacturing a capacitor connecting line of a memory according to claim 2, after the forming an oxide mask layer on the insulating layer, the method further comprises:
    forming a carbon mask layer and a second dielectric layer sequentially on a surface of the insulating layer through a deposition process, and the second dielectric layer comprising a silicon nitride layer and/or a silicon oxynitride layer.

4. The method of manufacturing a capacitor connecting line of a memory according to claim 3, before the patterning the insulating layer with the dielectric structures as a mask in the first direction, forming first isolation structures on sidewalls of the bit line structures, and patterning the insulating layer in a second direction, to form second isolation structures arranged at intervals between adjacent bit line structures, the method comprises:
    forming a photolithography coating on the second dielectric layer, and the photolithography coating comprising a photolithography anti-reflective layer and a photoresist layer;
    performing photolithography treatment on the photolithography coating, to obtain a photolithography material sacrificial layer patterned;
    forming an oxide layer on the photolithography material sacrificial layer and the second dielectric layer through a deposition process;
    etching the oxide layer through a dry etching process, to obtain the photolithography anti-reflective layer and a side wall of the photolithography anti-reflective layer; and
    removing the photolithography anti-reflective layer through an oxide gas, to obtain oxide sidewalls on the bit line structures.

5. The method of manufacturing a capacitor connecting line of a memory according to claim 4, wherein the forming conductive structures between the first isolation structures and the second isolation structures, and forming storage node contact structures comprises:
    etching the second dielectric layer and the carbon mask layer with the oxide sidewalls as a mask and removing the oxide sidewalls, to obtain a patterned carbon mask layer; and performing dry etching on the insulating layer with the patterned carbon mask layer and the dielectric structures as a mask, until the substrate is exposed, to form the first isolation structures in the first direction and the second isolation structures in the second direction.

6. The method of manufacturing a capacitor connecting line of a memory according to claim 5, wherein the forming conductive structures between the first isolation structures and the second isolation structures, and forming storage node contact structures further comprises:

removing the carbon mask layer through a dry etching process; and removing the oxide mask layer through a dry etching process, and forming the conductive structures between the first isolation structures and the second isolation structures, to form the storage node contact structures.

7. The method of manufacturing a capacitor connecting line of a memory according to claim 5, wherein a film thickness of the insulating layer is 80 nm to 120 nm, and/or a film thickness of the carbon mask layer is 80 nm to 130 nm, and a film thickness of the second dielectric layer is 25 nm to 45 nm.

8. The method of manufacturing a capacitor connecting line of a memory according to claim 2, wherein an etching ratio of the oxide mask layer and the insulating layer by dry etching ranges from 1:7 to 1:15.

9. The method of manufacturing a capacitor connecting line of a memory according to claim 8, when the oxide mask layer is removed through a dry etching process, an etching ratio of the oxide mask layer and the insulating layer is greater than or equal to 1:1.

* * * * *